United States Patent
Ookawa

(10) Patent No.: US 6,914,429 B2
(45) Date of Patent: Jul. 5, 2005

(54) MR IMAGING SYSTEM AND DATA ACQUISITION METHOD

(75) Inventor: Masashi Ookawa, Otawara (JP)

(73) Assignee: Kaburhiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/606,933

(22) Filed: Jun. 27, 2003

(65) Prior Publication Data

US 2004/0061496 A1 Apr. 1, 2004

(30) Foreign Application Priority Data

Jun. 28, 2002 (JP) ........................................ 2002-189883

(51) Int. Cl.$^7$ ................................................ G01V 3/00
(52) U.S. Cl. ...................................... 324/309; 324/307
(58) Field of Search ................................ 324/309, 307, 324/306, 300, 318, 322

(56) References Cited

U.S. PATENT DOCUMENTS

| | | | | |
|---|---|---|---|---|
| 5,402,067 A | * | 3/1995 | Pauly et al. | ................. 324/307 |
| 5,614,826 A | * | 3/1997 | Dixon | ......................... 324/307 |
| 5,713,358 A | | 2/1998 | Mistretta et al. | |
| 6,201,985 B1 | * | 3/2001 | Polzin et al. | ................. 600/411 |
| 6,400,151 B1 | * | 6/2002 | Haase et al. | ................. 324/309 |
| 6,483,307 B2 | | 11/2002 | Ookawa | |
| 2001/0004211 A1 | * | 6/2001 | Ookawa | ........................ 324/309 |

FOREIGN PATENT DOCUMENTS

| | | |
|---|---|---|
| JP | 6-114030 | 4/1994 |
| JP | 2000-350715 | 12/2000 |

OTHER PUBLICATIONS

Wieben et al, Simulation of Optimized Time–Resolved Segmented Elliptical–Centric 3D TRICKS for Abdominal MRA, Proc. Intl. Soc. Mag. Reson. Med. 8(2000), p. 1799.

* cited by examiner

*Primary Examiner*—Louis Arana
(74) *Attorney, Agent, or Firm*—Nixon & Vanderhye P.C.

(57) ABSTRACT

Magnetic resonance imaging uses a pulse sequence formed to include a pre-pulse, an RF excitation pulse, an encoding gradient pulse, and a reading gradient pulse. The encoding gradient pulse has an encoding amount determined to allow a data acquisition position in a k-space to be directed outward from a center of the k-space. A train of pulses including the RF excitation pulse, the encoding gradient pulse, and the reading gradient pulse is repeated to allow the number of times of data acquisition in the k-space to become larger as approaching to a central region of the k-space. The pre-pulse is formed to be reduced in an application rate to the RF excitation pulse as approaching to an outward position in the k-space. By way of example, this pulse sequence is used for contrast enhanced MRA carried out under a dynamic scan.

26 Claims, 5 Drawing Sheets

MR IMAGING SYSTEM AND DATA ACQUISITION METHOD

BACKGROUND OF THE INVENTION

1. Technical Field of the Invention

The present invention relates to magnetic resonance imaging based on a magnetic resonance phenomenon in an object to be examined to obtain images of the object, and in particular, to the magnetic resonance imaging designed to perform a pulse sequence based on an encoding technique known as "Elliptic Centric (or Swirl)" preferable to contrast enhanced MRA (Magnetic Resonance Angiography) adopting a dynamic scan performed with an MR (Magnetic Resonance) contrast agent injected into the object.

2. Description of Prior Art

Magnetic resonance imaging is based on a technique that magnetically excites nuclear spins in an object placed in a static magnetic field with an RF signal of a Larmor frequency of the nuclear spins, acquires an MR signal emanated from the object due to the excitation, and reconstructs an image using the MR signal.

In order to perform this magnetic resonance imaging, it is required to use a train of pulses, that is, a pulse sequence that has a variety of types of pulses lined up in time in accordance with a predetermined rule. Based on this pulse sequence, an RF pulse is transmitted from an RF coil to an object to be examined, and an echo signal (MR signal) emanated in response to this transmission from the object based on a magnetic resonance phenomenon of nuclear spins in the object. The received echo signal is then subjected to post-processing to convert it into echo data. If an image reconstruction algorithm relies on a Fourier transform, each echo data is mapped in a frequency space (k-space) at its encoded position defined by a specified amount of an encoding gradient pulse. A set of data filled in this frequency space is then applied to the Fourier transform, so that the data is reconstructed into a real-space image.

One type of magnetic resonance imaging is MRA (magnetic resonance angiography). This MRA can also be categorized into various types, which have been researched actively at present. One type of MRA is known as a contrast enhanced MRA technique that utilizes an MR contrast agent injected into an object to be examined. The contrast agent causes the enhancement in contrast of an image. For performing the contrast enhanced MRA, a dynamic scan is normally carried out, which allows a desired object's region to be scanned repetitively at intervals.

In the contrast enhanced MRA, it is preferred to conduct an encoding technique that gives priority to a central region of a view presented by an image, because a desired blood vessel to be observed, which shows a sharp increase in the contrast due to incoming of an injected contrast agent into the scanned region, is made to locate at the central region. As one type of this encoding technique, there is known "an Elliptic Central (or Swirl)" technique, which uses a pulse sequence in which encoding amounts are set to acquire data to be mapped in a central part of the k-space (i.e., frequency space) immediately after starting a scan.

Meanwhile, in the case of the contrast enhanced MRA, securing high temporal resolution is another factor which should be managed with high attention. From this viewpoint, a further sampling technique has been developed, wherein each unit of acquisition (i.e., RF excitation) in a pulse sequence is determined so that data to be mapped in a central part of the k-space is acquired more than data to be mapped in the remaining part thereof. This sampling technique is sometimes referred to as a "3Dtrics (or DRKS (Differential Rate k-space Sampling)" technique. Applying the processing on a view share technique to the data acquired using this sampling technique gives high temporal resolution to the dynamic scan.

This 3Dtrics technique performed in combination with the foregoing Elliptic Centric technique is exemplified by a reference "ISMRM 2000 No. 1799."

It is frequent that the foregoing MRA is carried out using a pulse sequence for a three-dimensional FFE (Fast FE) method. This pulse sequence often includes a desired-purpose pre-pulse, such as fat suppression pulse, applied before applying a radio frequency (RF) excitation pulse (flip pulse). However, applying the pre-pulse to an object before all of the RF excitation pulses results in a longer scan time. One countermeasure to remove such an inconvenience is provided by Japanese Patent Laid-open (KOKAI) No. 2001-170023. As proposed therein, the frequency of application of a pre-pulse is changed as the encoding position is shifted outward from the zero-encoding position in the k-space. This adjustment of application frequency of the pre-pulse has been reduced into practice in combination with the foregoing Elliptic Centric technique.

The application technique of the pre-pulse disclosed by Japanese Patent Laid-open (KOKAI) No. 2001-170023 would be, if performed, a help for shortening the scan time and obtaining the effect from a desired pre-pulse. However, in applying such application technique to the contrast enhanced MRA based on a three-dimensional (3D) FFE method which has become popular recently, there is a problem that the contrast enhanced MRA cannot be finished within a period of time during which an object (patient) is usually able to temporarily hold his or her breath without interruptions (i.e., object's one-time continuous breath hold period). The breath-hold technique is significant in removing object's motion artifacts from reconstructed MR images.

SUMMARY OF THE INVENTION

The present invention has been performed in consideration of the drawbacks that the foregoing conventional MRA imaging faces. An object of the present invention is to provide a magnetic resonance imaging system and a data acquisition technique for the system, which are in particular preferable to three-dimensional contrast enhanced MRA, in which high temporal resolution can be maintained, a scan can be finished within an object's one-Time continuous breath hold period which can be executable for ordinary objects, and a desired degree of contrast on an image can be secured in response to application of a desired pre-pulse (i.e., a desired effect of the pre-pulse).

In order to realize the above object, the present invention provides, as one aspect thereof, a magnetic resonance imaging system for producing an image based on data acquired from an object to be imaged, the data being acquired using a pulse sequence applied to the object and formed to include a pre-pulse, an RF excitation pulse, an encoding gradient pulse, and a reading gradient pulse. The magnetic resonance imaging system comprises: a memorization unit configured to memorize information indicative of the pulse sequence of which encoding gradient pulse has an encoding amount determined to allow a data acquisition position in a k-space to be directed outward from a center of the k-space, of which a train of pulses including the RF excitation pulse, the encoding gradient pulse, and the reading gradient pulse is repeated to allow the number of times of data acquisition in the k-space to become larger as approaching to a central region of the k-space, and of which pre-pulse is formed to be reduced in an application rate to the RF excitation pulse as approaching to an outward position in the k-space; a scan unit configured to scan the object using the pulse sequence memorized in the memorization unit, an acquisition unit configured to acquire data corresponding to an MR signal emanating from the object in response to the scan performed by the scan unit and to map the data in the k-space; and an image production means configured to reconstruct the data mapped in the k-space by the acquisition unit so that the image is produced.

Thus, data to be mapped in a central region of a k-space is subjected to larger times of acquisition than data to be mapped in the other regions of the k-space, whereby higher temporal resolution being secured. As to a desired-purpose pre-pulse, the closer an acquisition position to a central region of the k-space, the larger an application rate of the pre-pulse. Hence the pre-pulse can be applied to a desired region in the k-space, the desired region being susceptible to the pre-pulse in deciding the contrast of an MR image. In parallel, the other regions in the k-space are not subjected to many times of application of the pre-pulse, so that a scan time is still suppressed form increasing. Therefore, even for conducting three-dimensional contrast enhanced MRA, the scan time can be limited to a period of time falling a usual patient's one-time breath hold By way of example, the pulse sequence memorized in the memorization unit is formed to have the pre-pulse is applied only to data acquisition in a desired central region of the k-space. It is preferred that the pulse sequence memorized in the memorization unit is formed to have the pre-pulse applied such that, in a desired central region of the k-space, the pre-pulse is applied in a one to one correspondence manner compared to the RF excitation pulse, while, in an outer region of the desired central region, the pre-pulse is applied intermittently at a rate increasing as advancing outward in the k-space.

Preferably, the pre-pulse is one selected from a fat suppression pulse, an IR (Inversion Recovery) pulse, an MT (Magnetic Transfer) pulse, a pre-saturation pulse, and a tagging (Tag) pulse. It is also preferred that the pulse sequence consists of a two-dimensional or Three-dimensional FE (Gradient Echo)-system pulse train, the FE system including an FE method and an FFE (Fast FE) method.

As another aspect, the present invention provides a method for acquiring data from an object to be imaged in magnetic resonance imaging for producing an image based on the data mapped in a k-space, the data being acquired using a pulse sequence applied to the object and formed to include a pre-pulse, an RF excitation pulse, an encoding gradient pulse, and a reading gradient pulse, the method comprising the steps: scanning the object using the pulse sequence of which encoding gradient pulse has an encoding amount determined to allow a data acquisition position in the k-space to be directed outward from a center of the k-space, of which a train of pulses including the RF excitation pulse, the encoding gradient pulse, and the reading gradient pulse is repeated to allow the number of times of data acquisition in the k-space to become larger as approaching to a central region of the k-space, and of which pre-pulse is formed to be reduced in an application rate to the RF excitation pulse as approaching to an outward position in the k-space; receiving an MR (magnetic resonance) signal emanating from the object in response to the scanning; and mapping data corresponding to the MR signal into the k-space.

This method also achieves the similar effects to those obtainable from the foregoing magnetic resonance imaging system.

Still, as another aspect of the present invention, there is provided a program installed in a magnetic resonance imaging system and executed by a computer of the magnetic resonance imaging system in order to acquire data from an object to be imaged using a pulse sequence formed to include a pre-pulse, an RF excitation pulse, an encoding gradient pulse, and a reading gradient pulse, the acquired data being in a k-space, wherein the pulse sequence is formed such that the encoding gradient pulse has an encoding amount determined to allow a data acquisition position in the k-space to be directed outward from a center of the k-space, a train of pulses including the RF excitation pulse, the encoding gradient pulse, and the reading gradient pulse is repeated to allow the number of times of data acquisition in the k-space to become larger as approaching to a central region of the k-space, and The pre-pulse is formed to be reduced in an application rate to the RF excitation pulse as approaching to an outward position in the k-space.

Installing this program into a magnetic resonance imaging system provides the foregoing advantages.

DETAILED DESCRIPTION OF PREFERRED EMBODIMENT

Hereinafter, with reference to FIGS. 1 to 5, an embodiment of the present invention will now be described.

Figure 1:
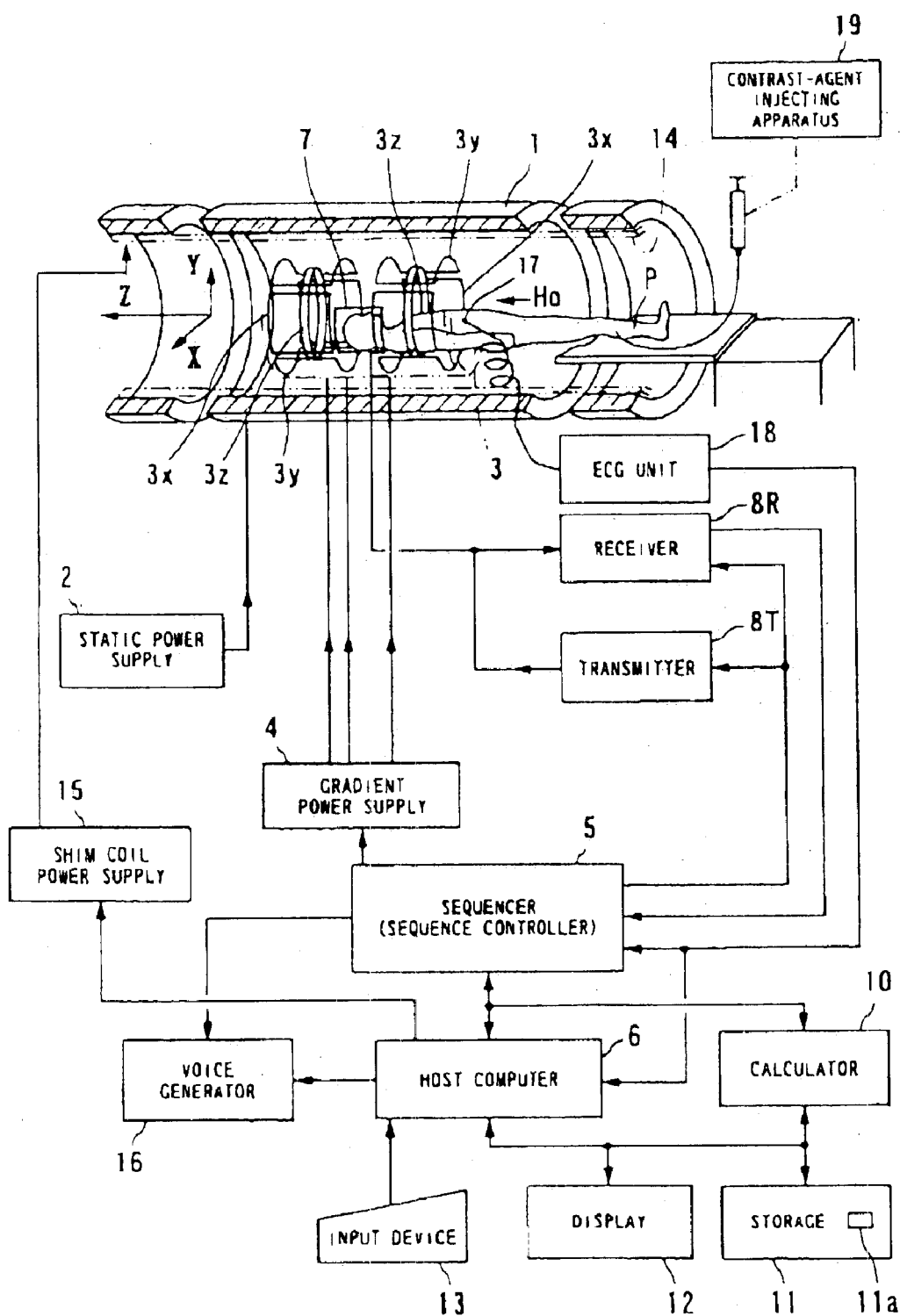
FIG. 1 shows a block diagram of a magnetic resonance imaging system according to an embodiment of the present invention.

A magnetic resonance imaging (MRI) system used in this embodiment is outlined in FIG. 1.

The magnetic resonance imaging system comprises a patient couch on which a patient (object to be examined) P lies down on its couch top, static field generating components for generating a static magnetic field, gradient generating components for appending positional information to the static magnetic field, transmitting/receiving components for transmitting and receiving radio-frequency signals, controlling and calculating components responsible for control of the whole system and reconstruction of images, electro-cardiographing components for acquiring an ECG signal which is a representative signal indicative of the cardiac temporal phase of a patient, and breath-hold instructing components for instructing the patient to temporarily hold his or her breath.

The static field generating components includes a magnet 1 that is of, for example, a superconducting type, and a static power supply 2 for supplying a current to the magnet 1, and generates a static magnetic field $H_0$ in an axial direction (Z-axis direction) in a cylindrical bore (diagnostic space) into which a patient P is inserted. The magnet unit is provided with shim coils 14. A current used to homogenize a static magnetic field is supplied from a shim coil power supply 15 to the shim coils 14 under the control of a host computer to be described later. The couch top of the patient couch on which the patient P lies down can be inserted into the bore of the magnet 1 so that the couch top can be withdrawn therefrom.

The gradient generating components has a gradient coil unit 3 incorporated in the magnet 1. The gradient coil unit 3 comprises three pairs (kinds) of x-, y-, and z-coils 3x to 3z used to generate gradients (magnetic field gradients) changing in strength in predetermined physical X-axis, Y-axis, and Z-axis directions that are mutually orthogonal. The gradient generating components further include a gradient power supply 4 for supplying pulsed currents to the x-, y-, and Z-coils 3x to 3z to generate pulsed gradients under the control of a sequencer 5 that will be described later.

The pulses currents supplied from the gradient power supply 4 to the x-, y-, and z-coils 3x to 3z are controlled, whereby gradients in the three physical X-, Y-, and Z-directions are synthesized arbitrarily. Thus, logical axial directions consisting of directions of a slice gradient $G_s$, a phase-encoding gradient $G_{68}$, and a readout (frequency-encoding) gradient $G_R$ can be specified and changed arbitrarily. The gradients to be applied individually in the slice direction, phase-encoding direction, and readout direction are superposed on the static magnetic field $H_0$.

The transmitting/receiving components comprises not merely an RF coil 7 located in the vicinity of a patient P in the bore inside the magnet 1 but also a transmitter 8T and a receiver 8R both electrically connected to the coil 7, which operate under the control of a sequencer 5 described later. The transmitter 8T supplies to the RF coil 7 pulsed RF currents of a Larmor frequency to excite spins to cause a nuclear magnetic resonance (NMR) phenomenon. The receiver 8R takes in MR signals (such as echo signals; RF signals) that the RF coil 7 has received, carries out various kinds of signal processing with the MR signals, such as pre-amplification, intermediate-frequency conversion, phase detection, lower-frequency amplification, and specified types of filtering, and A/D-converts the processed MR signals with produced digital data (i.e., original raw data).

The control and calculation components include a sequencer 5 (frequently referred to as a sequence controller), a host computer 6, a calculator 10, a storage 11, a display 12, an input device 13, and a voice generator 16. Of these, the host computer 6 has the function of providing the sequencer 5 with pieces of information based on a pulse sequence and managing the operations of the entire system according to previously installed software programs.

The host computer 6, which has a CPU and incorporated memories, commands the entire system to carry out an imaging scan in accordance with a predetermined pulse sequence. The imaging scan carried out in this embodiment is set to a dynamic scan for contrast enhanced MRA using a 3D (three-dimensional) FFE method However, an FE method can be adopted and a two-dimensional scan can also be adopted.

Though being detailed later, the pulse sequence is programmed in advance such that a "3Dtrics (or DRKS (Differential Rate k-space Sampling)" technique is carried out on the basis of an Elliptic Centric (or Swirl) technique and a pre-pulse is applied on the basis of features of the present invention. The data indicative of this program is stored in a recording medium 11a composed of, for example, a ROM of the storage 11.

As the pre-pulse, one or more pulses selected from a group of a fat suppression pulse, an IR (Inversion Recovery) pulse, an MT (Magnetic Transfer) pulse, a pre-saturation pulse, and a Tagging (Tag) pulse are used.

In order to suppress object's motion-originated artifacts appearing in an image, the contrast enhanced MRA carried out in this embodiment involves a breath-hold technique of an object (patient).

The sequencer 5, which has a CPU and memories, stores pulse sequence information sent from the host computer 6, and controls the operations performed by the gradient power supply 4, transmitter 8T, and receiver 8R according to the stored information. Additionally the sequencer 5 temporarily receives digital data corresponding to MR signals outputted from the receiver 8R, before transferring them to the calculator 10. The pulse sequence information is made up of all pieces of information required for operating the gradient power supply 4, transmitter 8T, and receiver 8R according to a series of pulses consisting of a pulse sequence. This pulse sequence information therefore includes information on the strength, duration, and application timing of pulsed currents applied to the x-, y-, and z-coil 3x to 3z.

The calculator 10 receives digital echo data sent from the receiver 8R via the sequencer 5, maps the received data in a Fourier space (known as a k-space or frequency space) formed in its incorporated memory, and performs a two-dimensional or a three-dimensional Fourier transform with the mapped data so as to reconstruct an image in the real space Moreover,the calculator 10 also carries out such processing as synthesis and difference calculation of image data.

The storage 11 has a memory that can preserve not only reconstructed image data but also image data that have undergone the synthesis and difference calculation. The storage unit 11 has a computer-readable recording medium 11a, such as ROM or disk, into which program data indicative of a desired type of pulse sequence for contrast enhanced MRA according to the present invention is recorded. The program data recorded in the recording medium 11a of the storage 11 is read out therefrom in response to a command issued by the host computer 6, and then sent to the sequencer 5 via the host computer 6.

The display 12 displays an image. The input device 13 is used by an operator to provide the host computer 6 with desired imaging conditions, a desired pulse sequence, and information about image synthesis and/or difference calculation.

Further, the breath-hold instructing components have a voice generator 16 as its one constituent. When receiving a command from the host computer 6, the voice generator 16 utters voice or massages or sound which requests the start and end of patient's temporal breath hold Accordingly, when performing contrast enhanced MRA, at an adequate timing before a contrast agent injected into the object (patient) P reaches a desired region to be scanned, a temporal breath hold for a predetermined scan time is instructed toward the patient P. The period of time for this temporal breath hold is set to an average time which can be continuous for ordinary parsons (for example, about 20 seconds). In contrast, there is some cases in which the temporal breath hold is not permitted. In such cases, the contrast enhanced MRA according to the present invention can be conducted without employing the breath hold technique.

Moreover, the electrocardiographing components comprises an ECG sensor 17 attached to the object's body to detect an electronic ECG signal and an ECG unit 18 performing various type of processing including digitization on the detected ECG signal, so that the processed ECG signal is sent to both the host computer 6 and the sequencer 5. This ECG signal is used, for example, by the sequencer 5 to perform an ECG-gating (electrocardiographing synchronization) imaging scan. This enables an appropriate determination of synchronous timing on the ECG-gating technique, whereby an imaging scan on the ECG-gating technique can be performed well to acquire data.

In this embodiment, so as to perform contrast enhanced MRA based on the dynamic scan, a contrast-agent injecting apparatus 19 is provided. This contrast-agent injecting apparatus 19 allows a contrast agent to be injected into the object P through the vein.

In the above configurations, the storage 11 corresponds to memorization means as a component of the present invention; the magnet 1, host computer 6, sequencer 5, gradient power supply 4, gradient coil unit 3, RF coil 7, and transmitter 8T form scan means as a component of the present invention; the RF coil 7, receiver 8R, and sequencer 5 form acquisition means as a component of the present invention; and a calculator 10 corresponds to image production means as a component of the present invention.

A pulse sequence used by a dynamic scan for contrast enhanced MRA will now be described.

This pulse sequence is designed so that not only a "3Dtrics (or referred to as DRKS (Differential Rate k-space Sampling))" technique can be performed based on the Elliptic Centric ("also known as Swirl") technique but also a pre-pulse can be applied based on a technique according to the present invention.

Figure 2:
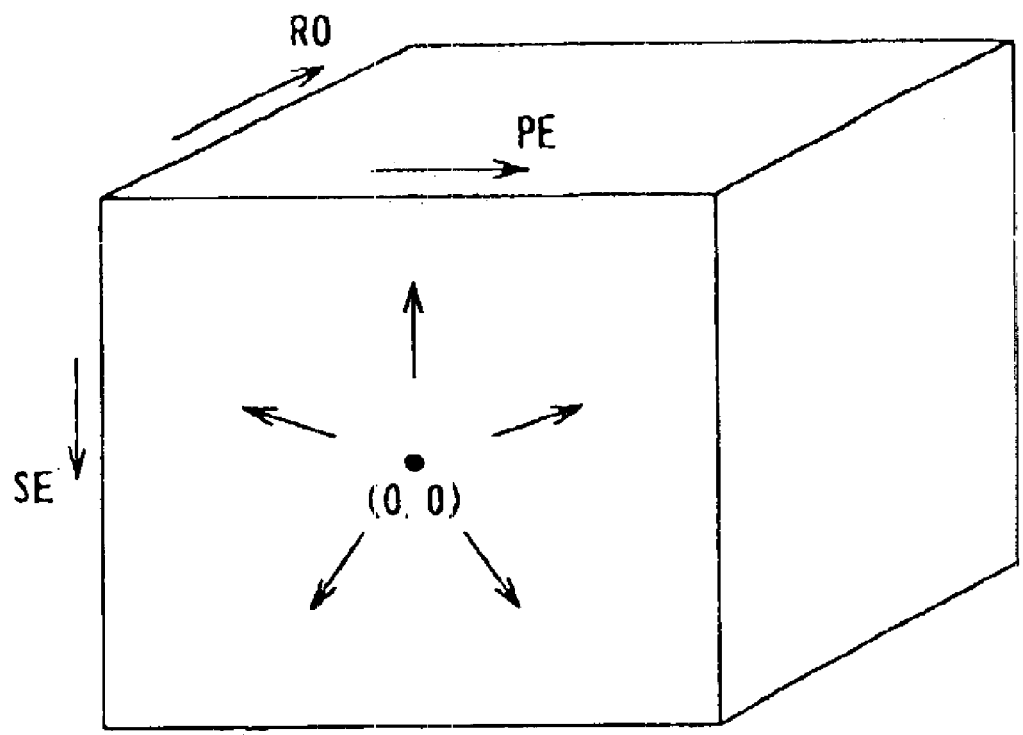
FIG. 2 is an illustration conceptually explaining an Elliptic Centric technique.

Practically, in order to give priority to both of a contrast in a central region of a view and a contrast immediately after starting a scan, the amount of the encoding gradient pulse is determined such that data to be mapped in a central region of the k-space (frequency space) immediately after the start of a scan is acquired on the basis of the Elliptic Centric technique. FIG. 2 conceptually represents this determination of the encoding gradient pulse. As shown therein, the amounts of the encoding gradient pulse (phase encoding and slice encoding amounts) are set in such a manner that the data acquisition advances in the three-dimensional k-space outward from the center (0, 0) in the encoding directions (phase encoding direction PE and slice encoding direction SE) of the three-dimensional k-space. One example is to make positions for data acquisition (i.e., data mapping) in the k-space advance to depict a spiral trajectory.

Figure 3:
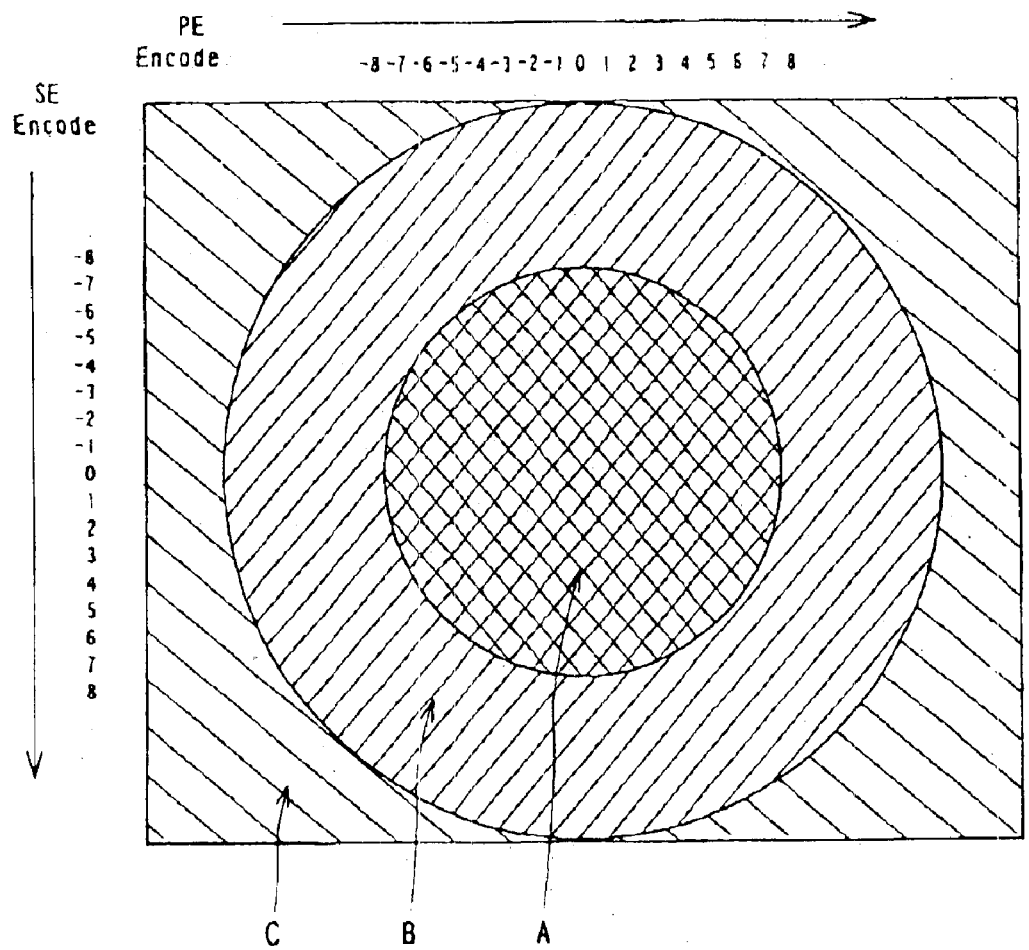
FIG. 3 is an illustration conceptually explaining a "3Dtrics" technique.

Based on the Elliptic Centric technique, the sampling order for the 3Dtrics technique is determined. FIG. 3 pictorially explains this sampling order. This example shows that the k-space is formed into three regions A to C divided concentrically from the center thereof (i.e., the position at the phase encoding amount=0 and the slice encoding amount=0) and the RF excitation is repeated to allow the central region A to be subjected to data acquisition repeatedly a predetermined times greater than that for the remaining regions. The shapes and the number of divided regions are not limited to the above. Alternatively, the k-space can be divided into elliptical regions or rectangular regions, and the number of regions may be four or more.

A practical sampling order is, for example, "A, B, A, C," "A, B, A, C," . . . , "A, B, A, C." To perform the sampling in this order, all the encoding amounts are lined up sequentially in time, and the lined-up encoding amounts are divided every repletion of "A, B, A, C" for memorization. This makes it possible that a dynamic scan is performed with taking every repletion of "A, B, A, C" as one unit.

From echo data acquired based on the sampling order consisting of each set of repetitions "A, B, A, C," a viewer share technique is applied to post-processing of the acquired data. Hence both of the first acquisition "A" and the second acquisition "A" in each set are used to produce data "$A_1, B_1, C_1$" and "$A_2, B_2, C_2$" thus improving the temporal resolution by 1.5 times.

Figure 4:
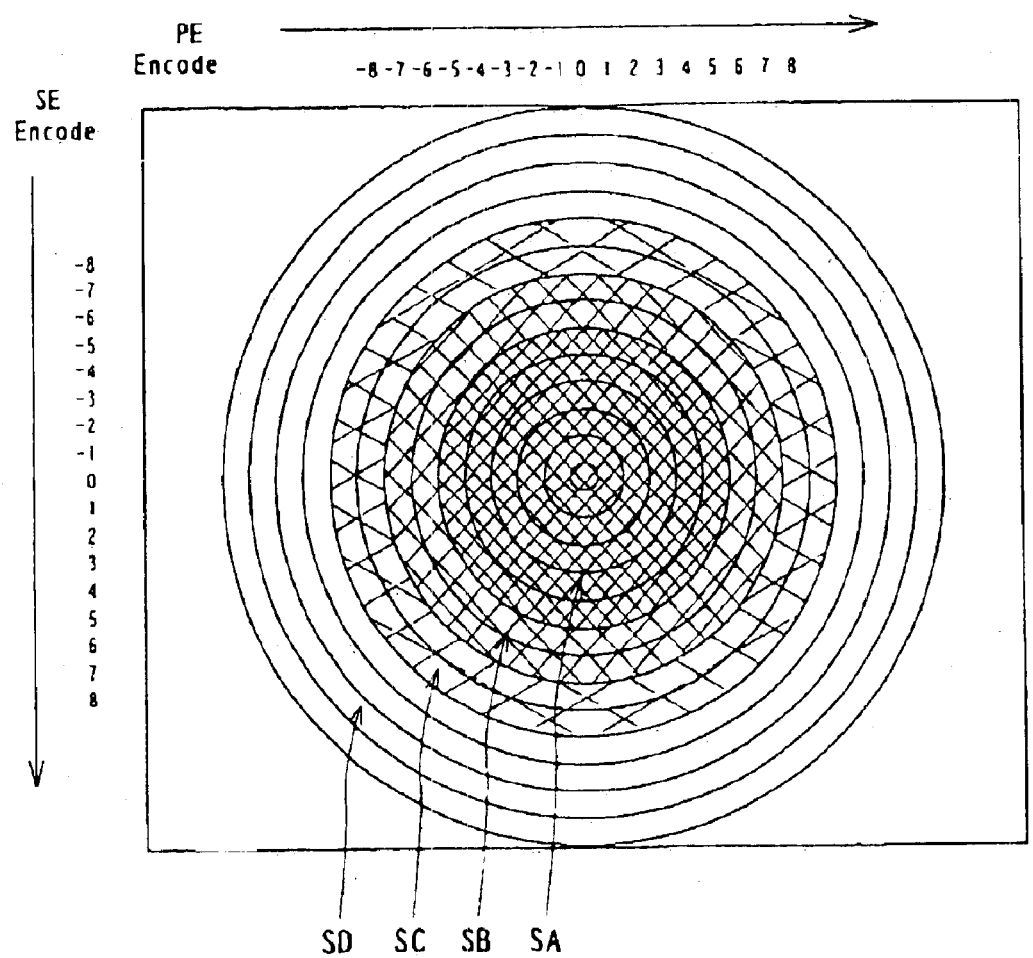
FIG. 4 conceptually illustrates application of a pre-pulse to which the present invention is applied.

The pre-pulse is applied in the sampling order based on the 3Dtrics technique using the foregoing Elliptic Centric algorithm. FIG. 4 pictorially explains this application of the pre-pulse.

As shown in FIG. 4, the k-space is divided concentrically into four regions SA to SD from the center (phase encoding amount=0 and slice encoding amount=0). As the data acquisition is made to advance outward from the central region SA in the k-space, a rate at which the pre-pulse is applied for data acquisition (application rate) is reduced. Conversely, the application rate of the pre-pulse in acquiring data to be mapped in the central region SA is set to a higher rate than those to the outer remaining regions.

One example is that, for acquiring data to be mapped in the central region SA, the pre-pulse is applied every RF excitation, while, for acquiring data to be mapped in the outside regions SB to SD, no pre-pulse is applied. That is, only for the central region SA, whenever each RF excitation pulse (flip pulse) is applied, one piece of pre-pulse is applied prior to the application of the RF excitation pulse, thus providing one to one correspondence between applying the pre-pulse and applying the RF excitation pulse. However, for the remaining regions SB to SA, the ratio of application between the pre-pulse and the RF excitation pulse becomes a ratio of "zero to 1."

Another example can be provided such that, for acquiring data to be mapped in the central region SA, the pre-pulse is applied every RF excitation, but, for acquiring data to be mapped in the outside regions SB to SD, the pre-pulse is applied intermittently. In addition, another example is to increase the intermittent rate (i.e., decrease the application rate) of the pre-pulse for the outside regions SB to SD as the data acquisition position is made to advance outward in the k-space, while still maintaining the one to one correspondence for the central region SA.

For instance, as shown in FIG. 4, when it is assumed that thirty encoding amounts are assigned to each of the phase and slice encoding directions, the regions SA to SD can be divided as follows:

(1) the region SA is defined by encoding amounts of 0 to ±5;

(2) the region SB is defined by encoding amounts of ±6 to ±7;

(3) the region SC is defined by encoding amounts of ±8 to ±9; and (4) the region SD is defined by the remaining encoding amounts.

In this situation, the number of times of the pre-pulse application can be determined such that:

(1A) as to the data acquisition involving encoding amounts of 0 to ±3 in the region SA, the pre-pulse is applied every RF excitation;

(1B) as to the data acquisition involving encoding amounts of ±4 to ±5 in the region SA, the pre-pulse is applied every two RF excitations;

(1C) as to the data acquisition involving encoding amounts of ±6 to ±7 in the region SB, the pre-pulse is applied every three RF excitations;

(1D) as to the data acquisition involving encoding amounts of ±8 to ±9 in the region SC, the pre-pulse is applied every five RF excitations; and (1E) as to the data acquisition involving the remaining encoding amounts in the region SD, no pre-pulse is applied.

In this setting of the pre-pulse, the shape and number of divided regions are not confined to the above stated one. For instance, the k-space can be divided into several elliptical or quadrangular regions. The number of divided regions may be five or more. Further, the intermittent rate of application for the pre-pulse may also be modified to another one.

Additionally, basically, how to divide the k-space in order to designate the sampling order based on the 3Dtrics technique and how to determine the application rate of the pre-pulse are independent of each other. According to for what the pre-pulse is applied and/or what region is scanned, how to divide the k-space and the application rate of the pre-pulse are decided.

Figure 5:
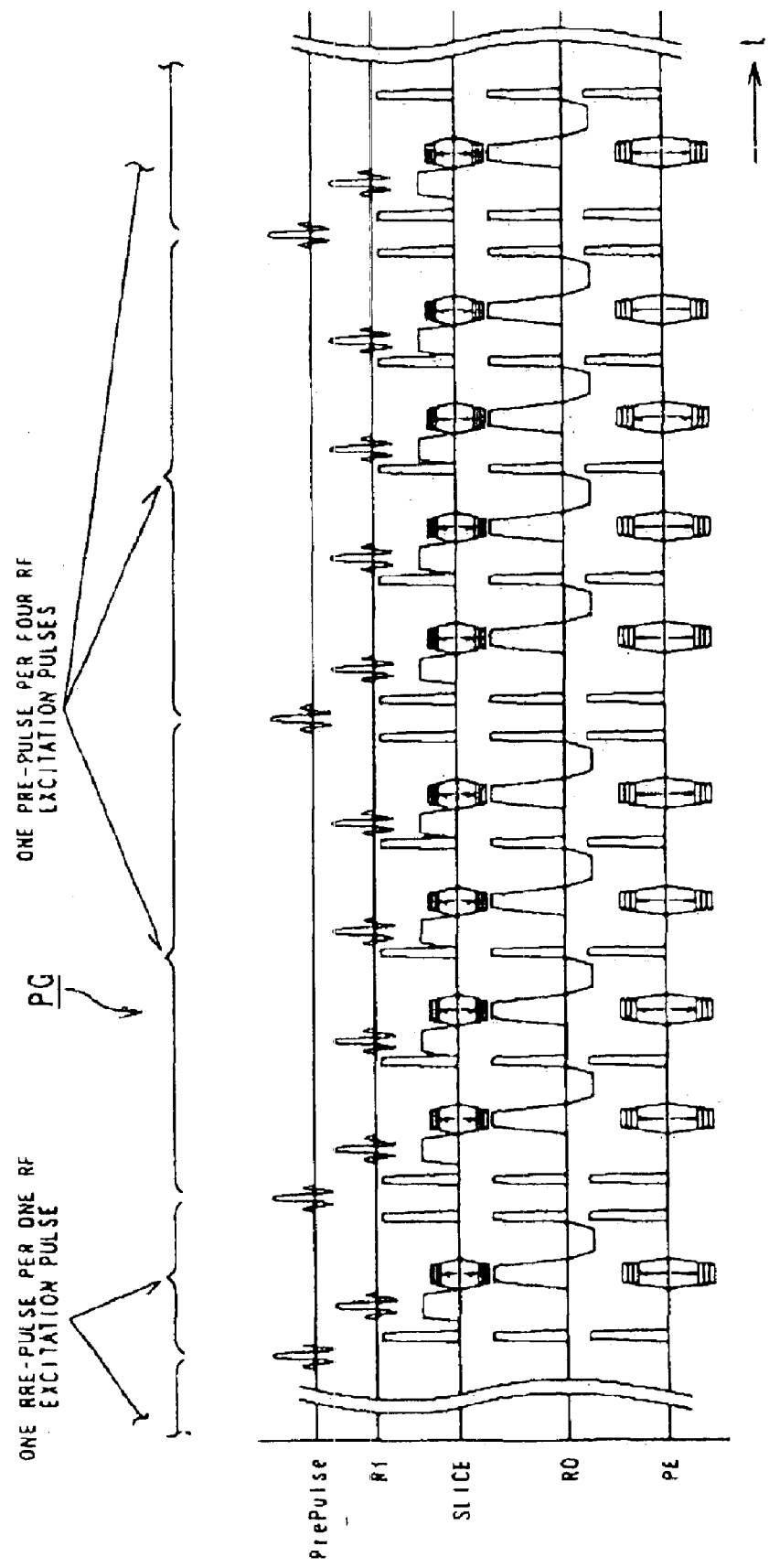
FIG. 5 is a flowchart showing an example of a pulse sequence according to a 3D FE method, which is used in an embodiment of the present invention.

The pulse sequence, which can be formed according to the above principle, is partially exemplified in FIG. 5, which also illustrates an alternative to a program PG according to the present invention. This pulse sequence is based on the 3D; FFE method, in which both of the phase encoding amount and the slice encoding amount are given so as to comply with the sampling order based on the 3Dtrics technique combined with the Elliptic Centric technique and to comply with how to apply the pre-pulse based on the principle derived from the present invention. Hence the pulse sequence in FIG. 5 shows sequentially in time a switchover from a state where the pre-pulse is applied every RF excitation (i.e., every application of a flip pulse) to another state where the single pre-pulse is applied every tour RF excitations.

A variety of types of pulses can be designated as the pre-pulse. By way of example, the pulses usable as the pre-pulse include a fat suppression pulse to suppress acquisition of an MR signal coming from fat in an object, an IR (Inversion Recovery) pulse to invert magnetic spins, an MT (Magnetic Transfer) pulse to positively cause an MT effect in an object, a pre-saturation pulse to have magnetic spins saturated at a given region before an imaging scan, and a tagging pulse to tag the magnetic spins of a flow of blood.

The pulse sequence produced as above is store in the storage 11 in advance. For conducting contrast enhanced MRA, the host computer 6 issues a command, and responsively to this insurance of the command, the data indicative of the pulse sequence is read out from the storage 11 to be sent to the sequencer 5 via the host computer 6.

An MR contrast agent is then injected into an object P through the vein. At an appropriate timing before the contrast agent reaches a region to be scanned in the object P, the host computer 6 makes the voice generator 16 to utter a voice message for a temporal breath hold toward the object P. Responsively to this message, the object (patient) P is to temporarily begin a continuous breath hold.

The sequencer 5 operates to, at an appropriate timing, to drive both of the gradient power supply 4 and the transmitter 8T on the basis of the information about the pulse sequence. This drive enables a desired region of the object P to be scanned magnetically under a dynamic scan based on the 3D-FFE method, for example. The sampling order during this scan is, if explained according to the example shown in FIG. 3, as already described, the order of regions "A, B, A, C," "A, B, A, C," . . . , "A, B, A, C." Thus as the acquisition position approaches to the central part of the k-space, data to be mapped in the k-space is sampled more largely.

In addition, during the dynamic scan, the closer data to be mapped in the k-space to the central region thereof, the higher the application rate of the pre-pulse to the acquired data. In other words, for acquiring lower-frequency-component data to be mapped in a central region in the k-space, such region being dominant in controlling an image contrast, the pre-pulse is applied at a higher rate than that in the outer surrounding regions of the k-space. In contrast, in cases where higher-frequency-component data mapped in those outer surrounding regions in the k-space, the rate of application of the pre-pulse is reduced. The higher-frequency-component data contributes to depicting the contour of a real-space image, but in the case of the contrast enhanced MRA, the contour of an image is not targeted as an interested region from a diagnostic viewpoint. Hence, in the outside regions in the k-space, priority is not given to the application of the pre-pulse.

The data acquired through the dynamic scan executed using the above pulse sequence is sent to the calculator 10, wherein the data is mapped in a three-dimensional k-space, processed based on a view share technique, and then reconstructed into real-space MR images.

As stated above, in the dynamic scan according to the present embodiment, data that should be mapped at the center of the k-space is first acquired immediately after starting the scan. During this acquisition, the closer the data to be mapped to a central region in the k-space, the more the number of acquisition times for the data. This makes it possible to give priority to the data to be mapped in the central region in the k-space. The acquired data including such priority-given data is subjected to post-processing, so that temporal resolution of the dynamic imaging can be raised. Concurrently, a desired type of pre-pulse can be applied, whereby a pre-pulse effect according to the type of the pre-pulse is given. In this application, the pre-pulse is preferentially applied when acquiring data to be mapped in a central region or regions near thereto, which are considered best significant for the contrast enhanced MRA.

Accordingly, compared to applying the pre-pulse to the object uniformly over the applications of the RF excitation pulses during acquisition of data to be mapped in the entire k-space, an image is able to have higher-quality contrast, thus non-evenness in image intensities can be enhanced, thus contrast-agent-specific images being depicted with high contrast. An effect derived from application of the pre-pulse (for example, a fat suppression effect) is enhanced in a multiplication manner with improvement in the temporal resolution, whereby higher-quality MRA images can be provided.

Furthermore, when acquiring data to be mapped in a higher-frequency-component region in the k-space, the pre-pulse is applied to the object only at a lower rate than that for the lower-frequency-component region. That is, the application rate in such a situation is reduced to a lower value or zero. It is therefore possible that the entire scan time is reduced largely, compared to the configuration of applying the pre-pulse to the object every RF excitation. For instance, even for a three-dimensional scan, the entire scan time can be kept to an order of 20 seconds or less: This scan time falls into a period of time during which an ordinary patient is able to keep continuing his or her one-time breath hold. Hence artifacts resulting from patient motion due to his or her breathing can be lessened. Data to be mapped in a higher-frequency-component range in a k-space is normally depicted as the contour portion of an object on an image, the contour portion having less interest in terms of medical diagnosis. This means that a minimum level of contour image which can represent, at least, its shape is still enough, and there is hardly influence on diagnosis.

By the selective (intermittent) application of the pre-pulse, an effect from a desired pre-pulse is obtained securely and the foregoing temporal resolution is kept to a higher level, thus providing fine images.

As described above, in the magnetic resonance imaging system and the data acquisition method therefore according to the present embodiment, a scan can be finished within a one-time breath hold period executable to ordinary patients, higher temporal resolution can be kept, and an effect from a desired pre-pulse can be obtained. Particularly, a dynamic scan preferable to a three-dimensional contrast enhanced MRA can be conducted securely. Three-dimensional image data obtained in this embodiment explicitly shows its superiority when such data is subjected to three-dimensional MPR (Multi Planar Reconstruction) or rotational display of image produced by an MIP (Maximum Intensity Projection) technique. Practically, compared to images produced by the conventional encoding technique, higher-quality images with less blurring and distortions can be provided.

For the sake of completeness, it should be mentioned that the embodiment explained so far is not a definitive list of possible embodiments of the present invention. The expert will appreciate that it is possible to combine the various construction details or to supplement or modify them by measures known from the prior art without departing from the basic inventive principle.

For instance, in the foregoing embodiment, the intensity (amount) of the pre-pulse may also be adjusted in parallel with controlling the application rate of the pre-pulse. In addition, the foregoing magnetic resonance imaging is not always limited to application as being contrast enhanced MRA. This magnetic resonance imaging according to the present invention is also applicable to a half-Fourier reconstruction algorithm and a parallel imaging using a multi-coil including a plurality of coil elements, thus providing more improved temporal resolution.

The entire disclosure of Japanese Patent Application No. 2002-189883 filed on Jun. 28, 2002 including the specification, claims, drawings and summary is incorporated herein by reference in its entirety.

What is claimed is:

1. A magnetic resonance imaging system for producing an image based on data acquired from an object to be imaged, the data being acquired using a pulse sequence including a pre-pulse, an RF excitation pulse, an encoding gradient pulse, and a reading gradient pulse, the magnetic resonance imaging system comprising:

a memorization unit configured to memorize the pulse sequence in which the encoding gradient pulse is applied to the object such that data is acquired outwardly from a center of k-space with respect to time, in which a train of pulses including the RF excitation pulse, the encoding gradient pulse, and the reading gradient pulse is applied to the object such that the number of times of data acquisition in a central region in k-space is larger than the number of times of data acquisition in an outer region in k-space, and in which the pre-pulse is applied to the object such that the number of application times of the pre-pulse for a central region in k-space is larger than the number of application times of the pre-pulse for an outer region in k-space;

a scan unit configured to scan the object using the pulse sequence memorized in the memorization unit;

an acquisition unit configured to acquire data from an MR signal obtained from the object in response to the scan performed by the scan unit; and an image reconstruction unit configured to reconstruct the image from the data acquired by the acquisition unit.

2. A magnetic resonance imaging system as in claim 1, wherein the pulse sequence include the pre-pulse only for data acquisition in a central region of k-space.

3. A magnetic resonance imaging system as in claim 2, wherein the pre-pulse includes at least one of a fat suppression pulse, an IR (Inversion Recovery) pulse, an MT (Magnetic Transfer) pulse, a pre-saturation pulse, and a tagging pulse.

4. A magnetic resonance imaging system as in claim 3, wherein the pulse sequence is formed into a two-dimensional or three-dimensional FE (Gradient Echo)-system pulse train, the FE system including practice of an FE method and an FFE (Fast FE) method.

5. A magnetic resonance imaging system as in claim 1, wherein the pulse sequence include the pre-pulse applied such that, in a central region of the k-space, the pre-pulse is applied in a one to one correspondence with respect to the RF excitation pulse, while, in an outer region of the central region, the pre-pulse is applied intermittently at a rate increasing as data acquisition advances outwardly in k-space.

6. A magnetic resonance imaging system as in claim 5, wherein the pre-pulse includes at least one of a fat suppression pulse, an IR (Inversion Recovery) pulse, an MT (Magnetic Transfer) pulse, a pre-saturation pulse, and a tagging pulse.

7. A magnetic resonance imaging system as in claim 6, wherein the pulse sequence is formed into a two-dimensional or three-dimensional FE (Gradient Echo)-system pulse train, the FE system including practice of an FE method and an FFE (Fast FE) method.

8. A magnetic resonance imaging system as in claim 1, wherein the pre-pulse includes at least one of a fat suppression pulse, an IR (Inversion Recovery) pulse, an MT (Magnetic Transfer) pulse, a pre-saturation pulse, and a tagging pulse.

9. A magnetic resonance imaging system as in claim 8, wherein the pulse sequence is formed into a two-dimensional or three-dimensional FE (Gradient Echo)-system pulse train, the FE system including practice of an FE method and an FEE (Fast FE) method.

10. A magnetic resonance imaging system as in claim 1, wherein the pulse sequence is formed into a two-dimensional or three-dimensional FE (Gradient Echo)-system pulse train, the FE system including practice of an FE method and an FFE (Fast FE) method.

11. A magnetic resonance imaging system as in claim 1, wherein the memorization unit is configured to memorize a pulse sequence having:

a train of pulses including the RF excitation pulse, the encoding gradient pulse, and the reading gradient pulse, the train of pulses being set such that the number of times of data acquisition in k-space becomes larger as data acquisition approaches a central region of k-space is the largest in the number of times of data acquisition in the central region; and pre-pulses which are set such that an application rate of the pre-pulse to the RF excitation pulse with respect to time becomes smaller as data acquisition moving away from a center in k-space.

12. A method for acquiring data from an object to be imaged in magnetic resonance imaging for producing an image based on the data mapped in a k-space, the data being acquired using a pulse sequence including a pre-pulse, an RF excitation pulse, an encoding gradient pulse, and a reading gradient pulse, the method comprising:

scanning the object using the pulse sequence in which the encoding gradient pulse is applied to the object such that data is acquired outwardly from a center of k-space with respect to time, in which a train of pulses including the RF excitation pulse, the encoding gradient pulse, and the reading gradient pulse is applied to the object such that the number of times of data acquisition in a central region in k-space is larger than the number of times of data acquisition in an outer region in k-space, and in which the pre-pulse is applied to the object such that the number of application times of the pre-pulse for a central region in k-space is larger than the number of application times of the pre-pulse for an outer region in k-space;

receiving an MR (magnetic resonance) signal emanating from the object in response to the scanning; and mapping data corresponding to the MR signal into the k-space.

13. A computer program installed in a computer-readable memory in a magnetic resonance imaging system which when executed by a computer in the magnetic resonance imaging system acquires data from an object to be imaged using a pulse sequence including a pre-pulse, an RF excitation pulse, an encoding gradient pulse, and a reading gradient pulse, the acquired data being mapped in a k-space, wherein the pulse sequence is formed such that the encoding gradient pulse has an encoding amount determined to allow data to be acquired outwardly from a center of the k-space with respect to time, a train of pulses including the RE excitation pulse, the encoding gradient pulse, and the reading gradient pulse is applied to the object such that the number of times of data acquisition in a central region in k-space is larger than the number of times of data acquisition in an outer region in k-space, and the pre-pulse is applied to the object such that the number of application times of the pre-pulse for a central region in k-space is larger than the number of application times of the pre-pulse for an outer region in k-space.

14. A computer program as in claim 13, wherein the pulse sequence is formed to have the pre-pulse applied such that, in a central region of k-space, the pre-pulse is applied in a one to one correspondence with respect to the RF excitation pulse, while, in an outer region of the central region, the pre-pulse is applied intermittently at a rate increasing as advancing outward in the k-space.

15. A computer program as in claim 14, wherein the pre-pulse includes at least one of a fat suppression pulse, an IR (Inversion Recovery) pulse, an MT (Magnetic Transfer) pulse, a pre-saturation pulse, and a tagging pulse.

16. A computer program as in claim 13, wherein the pre-pulse includes at least one of a fat suppression pulse, an IR (Inversion Recovery) pulse, an MT (Magnetic Transfer) pulse, a pre-saturation pulse, and a tagging pulse.

17. A computer program as in claim 13, wherein the pulse sequence is formed into a two-dimensional or three-dimensional FE (Gradient Echo)-system pulse train, the FE system including practice of an FE method and an FEE (Fast FE) method.

18. A magnetic resonance imaging system for producing an image based on three-dimensional data acquired from an object to be imaged, the data being acquired using a three-dimensional pulse sequence including a pre-pulse, an RF excitation pulse, an encoding gradient pulse, and a reading gradient pulse, the magnetic resonance imaging system comprising;

a memorization unit configured to memorize the three-dimensional pulse sequence
in which encoding gradient pulse is applied to the object such that the data is acquired outwardly from a center of k-space,
in which a train of pulses including the RF excitation pulse, the encoding gradient pulse, and the reading gradient pulse is applied to the object such that the number of times of data acquisition in the central region in k-space is larger than the number of times of data acquisition in an outer region in k-space, and
in which pre-pulse is applied to the object such that the number of application times of the pre-pulse for a central region in k-space is larger than the number of application times of the pre-pulse for an outer region in k-space;

a scan unit configured to scan the object using the three-dimensional pulse sequence memorized in the memorization unit;

an acquisition unit configured to acquire the data from an MR signal obtained from the object in response to the scan performed by the scan unit; and an image reconstruction unit configured to reconstruct the image from the data acquired by the acquisition unit.

19. A magnetic resonance imaging system as in claim 18, wherein the image reconstruction unit is configured to reconstruct the image based on a three-dimensional multi planar reconstruction (MPR) technique.

20. A magnetic resonance imaging system as in claim 18, wherein the image reconstruction unit is configured to reconstruct the image and to further perform a maximum intensity projection (MIP) technique on the reconstruct image.

21. A magnetic resonance imaging system as in claim 18, wherein the scan unit is configured to scan the object into which a contrast agent is injected for contrast enhanced MRA (magnetic resonance angiography).

22. A magnetic resonance imaging system as in claim 18, wherein the pulse sequence is set for parallel imaging.

23. A magnetic resonance imaging system according to claim 18, wherein the object is a human person and wherein, within a certain period of time during which the object is able to usually keep continuing his or her one-time breath hold, the scan unit is configured to scan the object using the three-dimensional pulse sequence and the acquisition unit is configured to acquire the data from the MR signal obtained from the object in response to the scan performed by the scan unit.

24. A magnetic resonance imaging system as in claim 23 wherein the certain period of time is 20 seconds.

25. A magnetic resonance imaging system as in claim 18, wherein the pulse sequence is set based on a half-Fourier reconstruction algorithm.

26. A magnetic resonance imaging system as in claim 18, wherein the object is a human person and wherein both of the scan unit and the acquisition unit operates with a breath-hold technique which compel the object to perform a holding of the breath.

* * * * *